(12) United States Patent
Jang et al.

(10) Patent No.: US 12,183,762 B2
(45) Date of Patent: Dec. 31, 2024

(54) IMAGE SENSING DEVICE

(71) Applicant: SK hynix Inc., Icheon-si (KR)

(72) Inventors: Jae Hyung Jang, Icheon-si (KR); Jong Chae Kim, Icheon-si (KR); Jae Won Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 246 days.

(21) Appl. No.: 17/870,540

(22) Filed: Jul. 21, 2022

(65) Prior Publication Data

US 2023/0050069 A1   Feb. 16, 2023

(30) Foreign Application Priority Data

Aug. 12, 2021   (KR) .................. 10-2021-0106902

(51) Int. Cl.
| | | |
|---|---|---|
| *H01L 27/146* | (2006.01) |
| *G01S 17/894* | (2020.01) |
| *H04N 25/63* | (2023.01) |
| *H04N 25/77* | (2023.01) |

(52) U.S. Cl.
CPC ...... *H01L 27/14641* (2013.01); *G01S 17/894* (2020.01); *H04N 25/63* (2023.01); *H04N 25/77* (2023.01)

(58) Field of Classification Search
None
See application file for complete search history.

(56) References Cited

U.S. PATENT DOCUMENTS

| | | |
|---|---|---|
| 8,102,452 B1 | 1/2012 | Wyatt |
| 2004/0130641 A1 | 7/2004 | Mabuchi |
| 2012/0086095 A1* | 4/2012 | Nishiyama ......... H04N 21/2743 |
| | | 257/E31.127 |
| 2015/0155328 A1 | 6/2015 | Park et al. |
| 2020/0021758 A1 | 1/2020 | Rosmeulen et al. |
| 2020/0395393 A1 | 12/2020 | Cheng et al. |

FOREIGN PATENT DOCUMENTS

| | | |
|---|---|---|
| CN | 206388705 U | 8/2017 |
| KR | 20180103124 A | 9/2018 |

OTHER PUBLICATIONS

First Office Action for CN Appl. No. 202210823928.4, mailed on Oct. 25, 2024, 11 pages with English translation.

* cited by examiner

*Primary Examiner* — Mark T Monk
(74) *Attorney, Agent, or Firm* — Perkins Coie LLP

(57) ABSTRACT

An image sensing device may include a pixel array. The pixel array includes a sensing region including a plurality of unit pixels, each unit pixel configured to detect incident light to generate photocharge indicative of the detected incident light, a bias field region doped with impurities and disposed along an edge of the sensing region and a contact portion connected to the bias field region to apply a bias voltage to the bias field region to move the photocharge in the sensing region.

18 Claims, 10 Drawing Sheets

IMAGE SENSING DEVICE

CROSS-REFERENCE TO RELATED APPLICATION

This patent document claims the priority and benefits of Korean patent application No. 10-2021-0106902, filed on Aug. 12, 2021, the disclosure of which is incorporated by reference in its entirety as part of the disclosure of this patent document.

TECHNICAL FIELD

The technology and implementations disclosed in this patent document generally relate to an image sensing device that includes pixels structured to detect incident light and measure a distance between the image sensing device and a targeted object.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IoT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices.

The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing device capable of improving photocharge detection efficiency, and reducing noise generated by dark current.

In accordance with an embodiment of the disclosed technology, an image sensing device may include a pixel array. The pixel array includes a sensing region including a plurality of unit pixels, each unit pixel configured to detect incident light to generate photocharge indicative of the detected incident light, a bias field region doped with impurities and disposed along an edge of the sensing region and a contact portion connected to the bias field region to apply a bias voltage to the bias field region to move the photocharge in the sensing region.

In some implementations, the pixel array further includes a passivation region formed to overlap the sensing region, wherein the pixel array is formed in a semiconductor layer, wherein the bias field region is located at a first depth within the semiconductor layer and the passivation region is located at a second depth within the semiconductor layer, and wherein the first depth is greater than the second depth.

In some implementations, the bias field region is formed to surround the passivation region and the bias field region is formed to contact the contact portion.

In some implementations, the bias field region is disposed along an edge of the passivation region and the passivation region is formed to overlap the bias field region.

In some implementations, each of the unit pixels includes a control region configured to generate a current in the semiconductor layer in which the unit pixels are disposed and a detection region configured to capture the photocharges moving by the current.

In some implementations, a demodulation control signal is applied to the control region, wherein the demodulation control signal is formed by repeating a first voltage and a second voltage at predetermined time intervals.

In some implementations, the demodulation control signal is any one of two different demodulation control signals having a phase difference of 180 degrees therebetween.

In some implementations, the demodulation control signal is any one of four different demodulation control signals having a phase difference of 90 degrees therebetween.

In some implementations, the photocharges move in a direction from the bias field region to the control region.

In some implementations, the bias voltage is lower than each of the first voltage and the second voltage.

In accordance with another embodiment of the disclosed technology, an image sensing device may include a sensing region including a plurality of unit pixels, each unit pixel including a control region for receiving a first voltage or a second voltage and a detection region for capturing electrons moving by the first voltage or the second voltage, a bias field region disposed along an edge of the sensing region, a contact portion connected to the bias field region to apply a bias voltage to the bias field region and a bias voltage controller configured to transfer the bias voltage to the contact portion, wherein the bias voltage is lower than each of the first voltage and the second voltage.

In some other implementations, the image sensing device may further include a passivation region formed to overlap the sensing region, wherein the bias field region is located at a first depth within a semiconductor layer and the passivation region is located at a second depth within the semiconductor layer, and wherein the first depth is greater than the second depth.

In some other implementations, the bias field region is formed to surround the passivation region and the bias field region is formed to contact the contact portion.

In some other implementations, the bias field region is disposed along an edge of the passivation region and the passivation region is formed to overlap the bias field region.

In accordance with another embodiment of the disclosed technology, an image sensing device may include a sensing region including a plurality of unit pixels formed in a substrate to generate the photocharges and capture the generated photocharges, a bias field region doped with a first impurity and formed from a surface of the substrate to a first depth in the substrate along an edge of the sensing region, a passivation region doped with a first impurity and formed from the surface of the substrate to a second depth in the substrate over the sensing region and a contact portion connected to the bias field region to apply a bias voltage to the bias field region to move the photocharges, wherein the first depth is greater than the second depth.

In some other implementations, the bias field region is formed to surround the passivation region and the bias field region is formed to contact the contact portion.

In some other implementations, the bias field region is disposed along an edge of the passivation region and the passivation region is formed to overlap the bias field region.

In some other implementations, each of the unit pixels includes a control region configured to generate a current in the semiconductor layer in which the unit pixels are disposed and a detection region configured to capture the photocharges moving by the current.

In accordance with an embodiment of the disclosed technology, an image sensing device may include a pixel array. The pixel array may include a sensing region in which a plurality of unit pixels for generating photocharges corresponding to incident light and capturing the generated photocharges is arranged; a bias field region disposed along an edge of the sensing region; and a contact portion configured to provide the bias field region with a bias voltage. The photocharges move by the bias voltage.

In accordance with another embodiment of the disclosed technology, an image sensing device may include a sensing region in which a plurality of unit pixels, each of which includes a control region for receiving a first voltage or a second voltage and a detection region for capturing electrons moving by the first voltage or the second voltage, is arranged in a matrix array, a bias field region disposed along an edge of the sensing region; a contact portion configured to provide the bias field region with a bias voltage, and a bias voltage controller configured to transmit the bias voltage to the contact portion. The bias voltage may be lower than each of the first voltage and the second voltage.

It is to be understood that both the foregoing general description and the following detailed description of the disclosed technology are illustrative and explanatory and are intended to provide further explanation of the disclosure as claimed.

DETAILED DESCRIPTION

Figure 1:
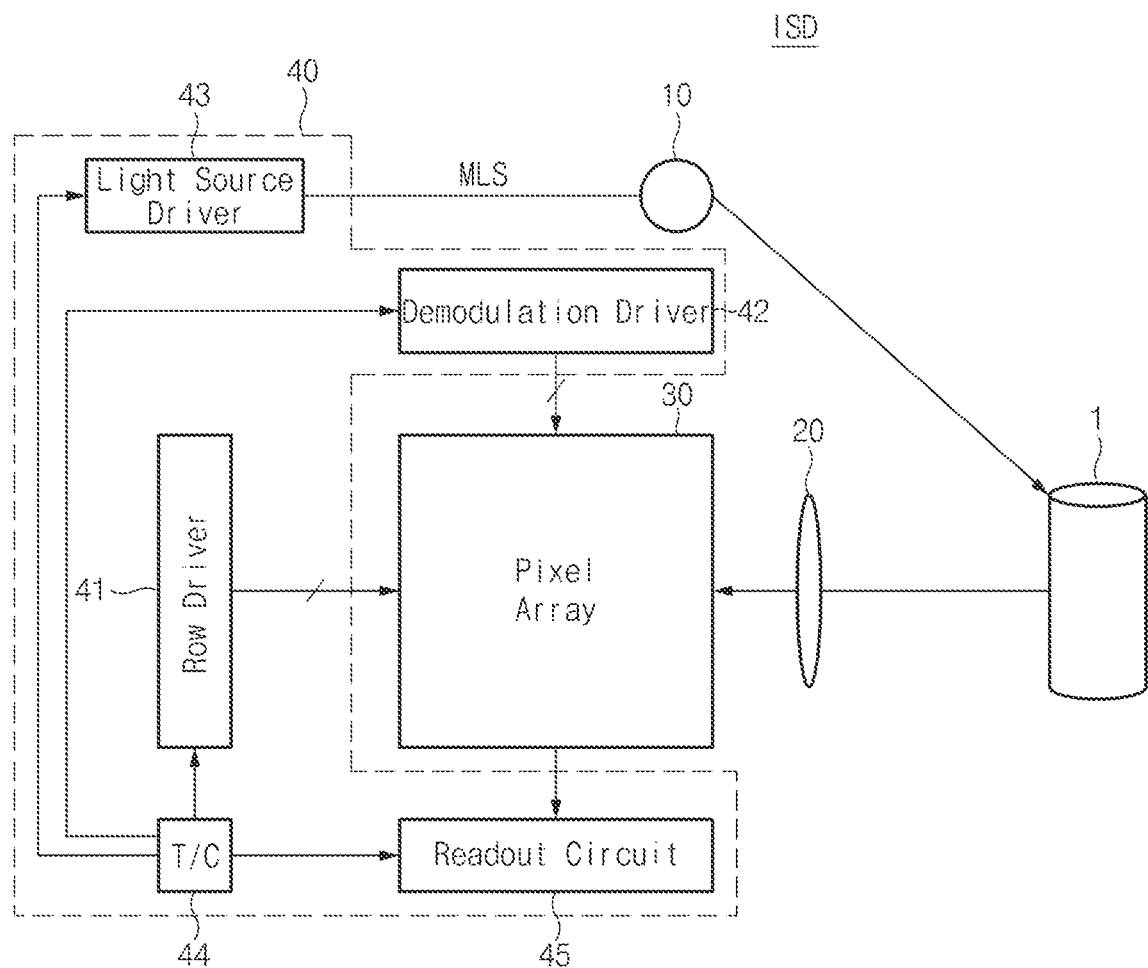
FIG. 1 is a block diagram illustrating an example of an image sensing device based on some implementations of the disclosed technology.

This patent document provides implementations and examples of image sensing device designs that may be used in configurations to substantially address one or more technical or engineering issues and to mitigate limitations or disadvantages encountered in some other image sensing device designs. Some implementations of the disclosed technology relate to an image sensing device that can improve photocharge detection efficiency while reducing noise generated by a dark current. In order to address the issues above, the disclosed technology can be implemented in some embodiments to provides an image sensing device that includes a bias field region disposed along an edge of a sensing region, thereby adjusting an electric field of a substrate by a bias voltage applied to the bias field region. The disclosed technology can be implemented in some embodiments to mitigate the recombination phenomenon of electrons that are generated in response to incident light by adjusting the depth of a bias field region, reducing occurrence of a dark current caused by formation of a contact region.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

There have been tremendous developments and advancements in range and depth measurement techniques that enable an image sensing device to measure a distance between the image sensing device and a target object. The rapid growth of electronic devices using image sensors, such as security devices, medical devices, automobiles, game consoles, virtual reality (VR)/augmented reality (AR) devices, and mobile devices has led to greater demand for an advanced method for measuring depth information. Such methods for measuring depth information using one or more image sensors includes a triangulation method, a Time of Flight (TOF) method, and an interferometry method. The Time of Flight (TOF) method is applicable to various technical fields, can be performed at a higher speed, and has superior cost efficiency.

The ToF method may be mainly classified into a direct method and an indirect method. Although both the direct method and the indirect method calculate the distance (i.e., depth) between the image sensor and a target object using emitted light and reflected light, the direct method and the indirect method may have different measurement methods.

The direct method may calculate a round trip time, and may measure the distance between the image sensor and a target object using the calculated round trip time. The indirect method may measure the distance between the image sensor and the target object using a phase difference. The direct method is used to measure a longer distance and thus is widely used in automobiles. The indirect method is used to measure a shorter distance and thus is widely used in various higher-speed devices designed to operate at a higher speed, for example, game consoles, mobile cameras, or others. The indirect method has a simple circuit design, and thus can be implemented at a lower cost.

As an example of indirect TOF sensor, a Current-Assisted Photonic Demodulator (CAPD) method is performed to detect electrons that have been generated in pixels using a majority current acquired by applying a control voltage to a unit pixel, using a voltage difference induced by the electrons. As such, the CAPD method can detect electrons more quickly and can detect electrons formed at a deep depth by using the majority current.

FIG. 1 is a block diagram illustrating an example of an image sensing device ISD based on some implementations of the disclosed technology.

Referring to FIG. 1, the image sensing device ISD may measure the distance between the image sensing device ISD and a target object 1 using the Time of Flight (TOF) principle. The image sensing device ISD may include a light source 10, a lens module 20, a pixel array 30, and a control block 40.

The light source 10 may emit light to a target object 1 upon receiving a light modulation signal MLS from the control block 40. The light source 10 may be a laser diode (LD) or a light emitting diode (LED) for emitting light (e.g., near infrared (NIR) light, infrared (IR) light or visible light) having a specific wavelength band. In another implementation, the light source 10 may be any one of a Near Infrared Laser (NIR), a point light source, a monochromatic light source combined with a white lamp or a monochromator, and a combination of other laser sources. For example, the light source 10 may emit infrared light having a wavelength of 800 nm to 1000 nm. Light emitted from the light source 10 may be light (e.g., modulated light) modulated by a predetermined frequency. Although FIG. 1 shows only one light source 10 for convenience of description, and a plurality of light sources may also be arranged in the vicinity of the lens module 20.

The lens module 20 may collect light reflected from the target object 1, and may allow the collected light to be focused onto pixels (PX) of the pixel array 30. For example, the lens module 20 may include a focusing lens having a surface formed of glass or plastic or another cylindrical optical element having a surface formed of glass or plastic. The lens module 20 may include a plurality of lenses that is arranged to be focused upon an optical axis.

The pixel array 30 may include unit pixels (PX) consecutively arranged in rows and columns in a two-dimensional (2D) matrix array. The unit pixel (PX) may be a minimum unit that is repeatedly arranged in the same shape within the pixel array.

In some implementations, each of the unit pixels may include a plurality of sub-pixels arranged in a matrix array.

The unit pixels (PX) may be formed over a semiconductor substrate or an epitaxial layer. Each unit pixel (PX) may convert incident light received through the lens module 20 into an electrical signal corresponding to the intensity of incident light, and may generate a pixel signal using the electrical signal. In this case, the pixel signal may be a signal indicating the distance between the unit pixel and the target object 1 without indicating the color of the target object 1.

A region where the unit pixels (PX) are disposed over the pixel array 30 will hereinafter be referred to as a sensing region. The unit pixels (PX) located in the sensing region may convert incident light into electric signals corresponding to the intensity of incident light, and may thus output pixel signals.

The pixel array 30 may include a bias field region located along the edge of the sensing region. The bias field region may be formed in a semiconductor substrate or an epitaxial layer. The image sensing device ISD may adjust the pixel signals output from the unit pixels (PX) by adjusting a voltage applied to the bias field region.

Each unit pixel (PX) may be a Current-Assisted Photonic Demodulator (CAPD) pixel. The structure and operations of each unit pixel (PX) will hereinafter be described with reference to FIGS. 2-10.

The control block 40 may emit light to the target object 1 by controlling the light source 10, may process each pixel signal corresponding to light reflected from the target object 1 by driving unit pixels (PX) of the pixel array 30, and may measure the distance between the unit pixels and the surface of the target object 1 using the processed result.

The control block 40 may include a row driver 41, a demodulation driver 42, a light source driver 43, a timing controller 44, and a readout circuit 45.

The row driver 41 may activate unit pixels (PX) of the pixel array in response to a timing signal generated by the timing controller 44. For example, the row driver 41 may generate a control signal for selecting and controlling at least one row line from among the plurality of row lines. The control signal may include a reset signal RST for controlling a reset transistor, a transfer signal TRG for controlling transmission of photocharges accumulated in a detection region, a floating diffusion signal FDG for providing additional electrostatic capacity at a high illuminance level, a selection signal SEL for controlling a selection transistor, and others.

Although FIG. 1 illustrates the row driver 41 arranged in a column direction (e.g., a vertical direction) of the pixel array 30 for convenience of description, at least part of the row driver 41 may be arranged in a row direction (e.g., a horizontal direction) of the pixel array 30.

The demodulation driver 42 may generate a demodulation control signal to be applied to at least one unit pixel from among the plurality of unit pixels in response to a timing signal generated by the timing controller 44. The demodulation control signal may generate a potential difference in the substrate. The potential difference generated in the substrate may generate a hole current for moving electrons of the substrate.

The light source driver 43 may generate a light modulation signal MLS for operating the light source 10 in response to a control signal from the timing controller 44. The light modulation signal MLS may be a signal that is modulated by a predetermined frequency.

The timing controller 44 may generate a timing signal to control the row driver 41, a demodulation driver 42, the light source driver 43, and the readout circuit 45.

The readout circuit 45 may process pixel signals received from the pixel array 30 under control of the timing controller 44, and may thus generate pixel data such as digital pixel data. To this end, the readout circuit 45 may include a correlated double sampler (CDS) circuit for performing correlated double sampling (CDS) on the pixel signals generated by the pixel array 30.

In addition, the readout circuit 45 may include an analog-to-digital converter (ADC) for converting output signals of the CDS circuit into digital signals. In addition, the readout circuit 45 may include a buffer circuit that temporarily stores pixel data generated by the analog-to-digital converter (ADC) and outputs the pixel data under control of the timing controller 44. Since the pixel array 30 includes CAPD pixels, two column lines for transmitting the pixel signal may be assigned to each column of the pixel array 30, and structures for processing the pixel signal generated from each column line may correspond to the respective column lines.

The light source 10 may emit light (e.g., modulated light) modulated by a predetermined frequency to a scene captured by the image sensing device ISD. The image sensing device ISD may sense modulated light (i.e., incident light) reflected from the target objects 1 included in the scene, and may thus generate depth information for each unit pixel (PX).

A time delay based on the distance between the image sensing device ISD and each target object 1 may occur between the modulated light and the incident light. The time delay may be denoted by a phase difference between the signal generated by the image sensing device ISD and the light modulation signal MLS controlling the light source 10. An image processor (not shown) may calculate a phase difference generated in the output signal of the image sensing device ISD, and may thus generate a depth image.

Figure 2:
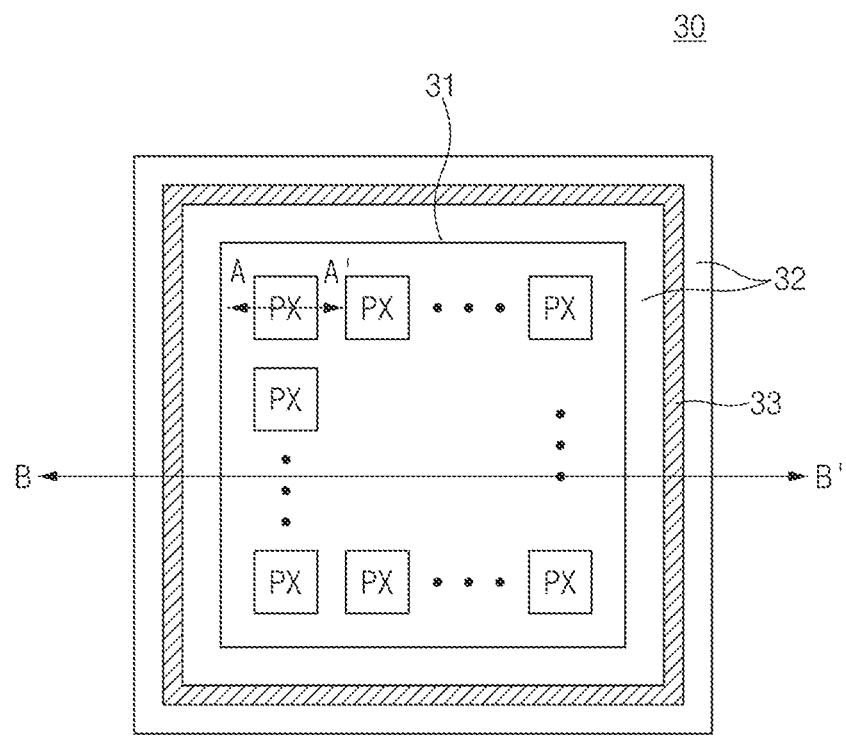
FIG. 2 is a schematic view illustrating an example of a pixel array based on some implementations of the disclosed technology.

FIG. 2 is a schematic diagram illustrating an example of the pixel array 30 based on some implementations of the disclosed technology.

Referring to FIG. 2, the pixel array 30 may include a sensing region 31 that includes a plurality of unit pixels such as image sensing pixels and phase detection pixels, and a bias field region 32 disposed along an edge of the sensing region 31. In some implementations, a contact portion 33 is formed in or in electrical contact with the bias field region 32 to apply a bias voltage to the bias field region 32.

In addition, the contact portion 33 may be coupled to a bias voltage controller (not shown) configured to provide the contact portion 33 with a bias voltage. In some implementations, the bias voltage controller may be included in a control block (e.g., 40 of FIG. 1).

In order for the unit pixels (PX) to detect incident light based on control or timing signals received from the timing controller (e.g., 44 of FIG. 1), the bias voltage controller may transmit the bias voltage to the substrate including the sensing region 31.

The plurality of unit pixels (PX) disposed in the sensing region 31 may generate pixel signals, respectively, in response to their respective received incident light. The cross-sectional view of each unit pixel (PX) and other circuits connected to the unit pixel (PX) will be described later with reference to FIG. 3.

In some implementations, the bias field region 32 may be disposed along the edge of the sensing region 31. The bias field region 32 may be formed in a semiconductor substrate or epitaxial layer in which the pixel array 30 is disposed. Since the bias field region 32 is disposed along the edge of the sensing region 31, the image sensing device ISD can effectively adjust an electric potential gradient inside the pixel array 30.

In some implementations, the semiconductor substrate or the epitaxial layer in which the bias field region 32 is formed may be doped with P-type impurities. In addition, the bias field region 32 may be a P-type impurity region having a higher doping concentration than the semiconductor substrate or the epitaxial layer.

The lens module 20 may be formed to overlap the pixel array 30. As incident light is focused by the lens module 20, the amount of light rays that reach one unit pixel (PX) located adjacent to the edge of the pixel array 30 may be different from the amount of light rays that reach another unit pixel (PX) located adjacent to the center of the pixel array 30.

Such a difference in the amount of light rays between the unit pixels (PX) can result in a difference between pixel signals depending on the positions of the unit pixels (PX) over the pixel array 30. Specifically, the unit pixels (PX) located adjacent to the edge of the pixel array 30 may receive a smaller amount of incident light rays than other unit pixels (PX) located adjacent to the center of the pixel array 30. As such, the unit pixels (PX) may collect different amounts of photocharge generated in response to the incident light depending on the locations of the unit pixels (PX), creating a difference between pixel signals.

In some implementations, as the bias field region 32 has a different doping concentration from the semiconductor substrate or the epitaxial layer, an electric potential gradient may occur between the bias field region 32 and other regions of the pixel array 30.

Such an electric potential gradient causes photocharges generated in a region adjacent to the bias field region 32 to move from the region adjacent to the bias field region 32 to the unit pixels (PX). As a result, the unit pixels (PX) adjacent to the bias field region 32 may more easily collect the photocharges than other unit pixels (PX) located far from the bias field region 32.

Accordingly, a difference in pixel signals between one pixel located adjacent to the edge of the pixel array 30 and another pixel (PX) located adjacent to the center of the pixel array 30 can be compensated for by the bias field region 32.

The contact portion 33 may be formed to overlap the bias field region 32. In some implementations, the contact portion 33 may include metal. For example, the metal may include at least one of tungsten (W), aluminum (Al), and copper (Cu). In some other implementations, the contact portion 33 may include polysilicon (Si).

The contact portion 33 may be in contact with the bias field region 32. The contact portion 33 may apply a bias voltage to the bias field region 32. In some implementations, the bias voltage may be a negative (−) voltage. As the negative (−) voltage is applied to the bias field region 32, the electric potential gradient may occur between the bias field region 32 and other regions of the pixel array 30.

The electric potential gradient generated when the negative (−) voltage is applied to the bias field region 32 may be greater than the electric potential gradient generated when the negative (−) voltage is not applied to the bias field region 32.

In other words, the negative(−) voltage applied to the bias field region 32 can facilitate the movement of the photocharges, and thus the unit pixels (PX) can more easily collect photocharges when the negative(−) voltage is applied to the bias field region 32 compared to when the negative(−) voltage is not applied to the bias field region 32.

In some implementations, the bias field region 32 and the contact portion 33 do not overlap the sensing region 31, enabling the sensing region 31 to maximize a light reception region.

Figure 3:
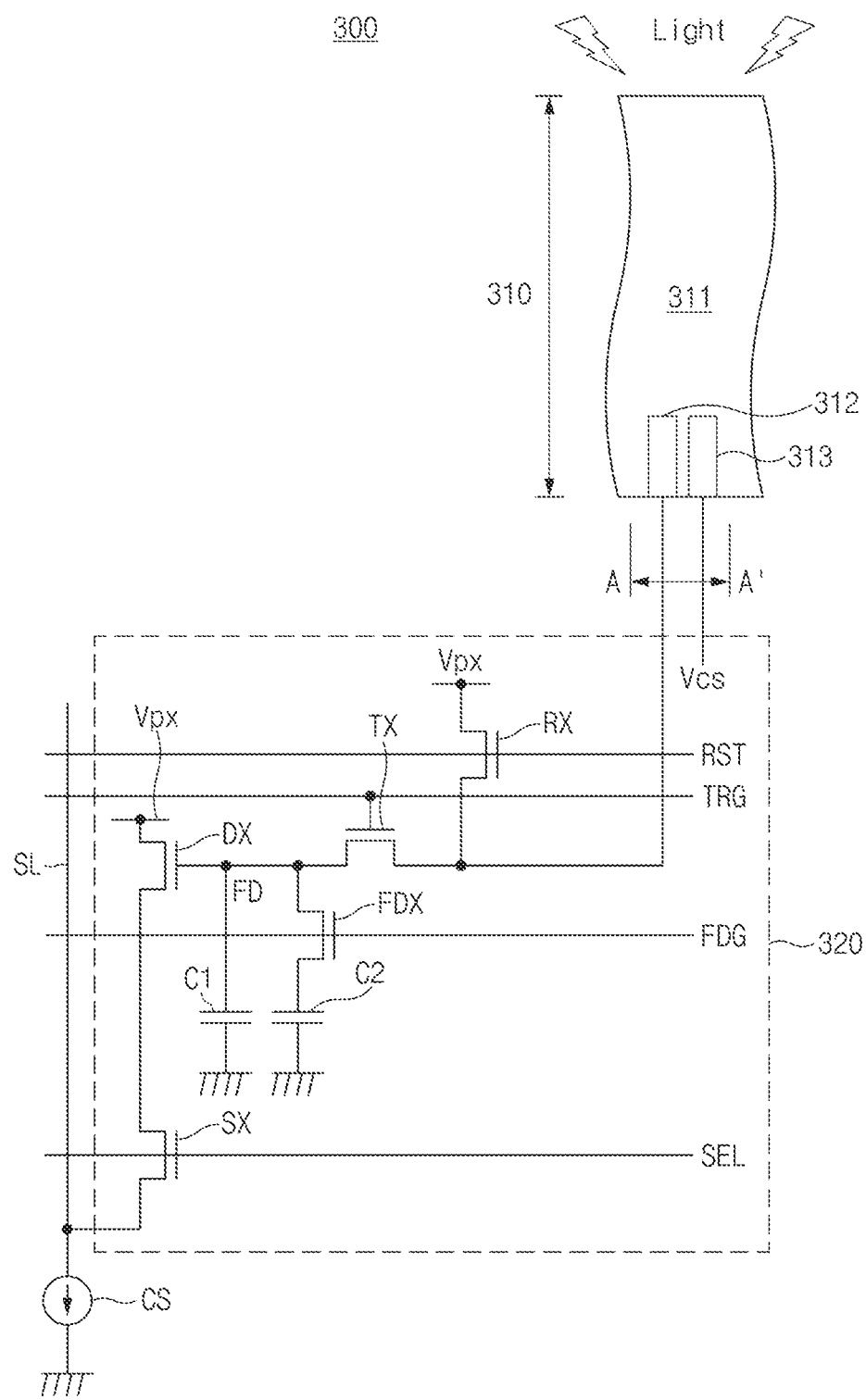
FIG. 3 is a schematic diagram illustrating a cross-section of a unit pixel taken along a line A-A' shown in FIG. 2 and a circuit diagram of constituent circuits connected to the unit pixel based on some implementations of the disclosed technology.

FIG. 3 is a schematic diagram 300 illustrating a cross-section of the unit pixel (PX) taken along a line A-A' shown in FIG. 2 and a circuit diagram of constituent circuits connected to the unit pixel (PX) based on some implementations of the disclosed technology.

The cross-sectional structure of the unit pixel (PX) and a method for operating the unit pixel (PX) will hereinafter be described with reference to FIG. 3.

The unit pixel (PX) may include a photoelectric conversion region 311, a detection region 312, and a control region 313. In some implementations, the unit pixel (PX) may be formed in a semiconductor layer 310. The semiconductor layer 310 may include a semiconductor substrate or an epitaxial layer. For example, the semiconductor substrate may include a silicon wafer, and the epitaxial layer may include a crystal growth layer formed on the silicon wafer. In some implementations, the detection region 312 collects photocharges generated by the photoelectric conversion region 311, and the control region 313 receives control signals for controlling such operations.

In the example in FIG. 3, the photoelectric conversion region 311 may be formed in the semiconductor layer 310, and light rays may be incident upon one surface of the semiconductor layer 310. The surface upon which light is incident will hereinafter be referred to as a light reception surface.

In some implementations, the unit pixel (PX) is located at the sensing region 31 shown in FIG. 2, and thus the photoelectric conversion region 311, the detection region 312, and the control region 313 may be included in the sensing region 31.

The semiconductor layer 310 may further include a passivation region (not shown) and a bias field region (not shown) but the circuit elements shown in FIG. 3 are limited to certain elements of each unit pixel (PX) depicted for the purpose of describing features and operations of the unit pixel.

In implementations, the photoelectric conversion region 311 in each unit pixel (PX) is structured to respond to incident light and to generate photocharge corresponding to incident light received by the unit pixel (PX). The photoelectric conversion region 311 may include a plurality of doped regions or layers stacked on top of each other. For example, the photoelectric conversion region 311 may include a plurality of N-type doped regions and a plurality of P-type doped regions.

Each of the detection region 312 and the control region 313 may be formed to have a predetermined depth from a surface facing or opposite to the light reception surface of the incident light with respect to the semiconductor substrate or the epitaxial layer.

Each of the detection region 312 and the control region 313 may be included in the unit pixel (PX). The detection region 312 may be doped with different impurities from the semiconductor layer 310. For example, when the semiconductor layer 310 is doped with P-type impurities, the detection region 312 may be doped with N-type impurities. The detection region 312 may include a plurality of doped regions having different impurity densities.

The detection region 312 may receive a detection voltage as an input. As the detection voltage is applied, the detection region 312 can easily collect photocharges generated in the photoelectric conversion region 311. A plurality of circuits may be coupled to the detection region 312 to process collected electrons and convert the electrons into an electrical signal. The plurality of circuits may be formed for each unit pixel (PX) including each detection region 312.

The control region 313 may be doped with the same impurities as the semiconductor layer 310. For example, when the semiconductor layer 310 is doped with P-type impurities, the control region 313 may be doped with P-type impurities. The control region 313 may include a plurality of doped regions having different impurity densities.

Although FIG. 3 illustrates the detection region 312 and the control region 313, each of which extends from one surface facing or opposite to a light reception surface toward the light reception surface, as being similar in length by way of example, it should be noted that the control region 313 may be formed to have a longer length than the detection region 312. When the control region 313 has a longer length than the detection region 312, the detection region 312 can more easily capture photocharges by the electric potential gradient formed between the photoelectric conversion region 311 and the control region 313.

In some implementations, demodulation control signals ($V_{cs}$) respectively corresponding to the unit pixels (PX) may be applied to the control region 313. The demodulation control signals ($V_{cs}$) applied to adjacent unit pixels (PX) may have different phase difference values.

In some implementations, the demodulation control signal ($V_{cs}$) may be any one of two signals having a phase difference of 180 degrees, and any one of the two signals may be applied to two adjacent unit pixels (PX).

In other implementations, the demodulation control signal ($V_{cs}$) may be any one of four different signals having a phase difference of 90 degrees, and any one of the four signals may be applied to four adjacent unit pixels (PX).

The demodulation control signal ($V_{cs}$) may allow a first voltage ($V_1$) or a second voltage ($V_2$) to be repeatedly applied to the control region 313 at predetermined time intervals.

When the first voltage ($V_1$) is applied to the control region 313, a current may flow between the control region 313 and the photoelectric conversion region 311 or between the control region 313 and the bias voltage region (not shown).

Such a current caused by the first voltage ($V_1$) may be a hole current. As the hole current is generated, the detection region 312 adjacent to the control region 313 can capture electrons. For example, the first voltage ($V_1$) may be 1.2 volts (1.2 V). A logic value of the demodulation driver 42 for applying the first voltage ($V_1$) may be at a logic high level (H).

The second voltage ($V_2$) applied to the control region 313 may be generated when no current flows either between the control region 313 and the photoelectric conversion region 311 included in each unit pixel (PX) or between the control region 313 and the bias voltage region. For example, the second voltage ($V_2$) may be a ground voltage ($V_{gnd}$). A logic value of the demodulation driver 42 for applying the second voltage ($V_2$) may be at a logic low level (L).

The demodulation control signal ($V_{cs}$) may allow the first voltage ($V_1$) and the second voltage ($V_2$) to be applied to the control region 313 at predetermined time intervals. The demodulation control signals respectively applied to the unit pixels will be described later with reference to FIGS. 8 and 9.

In some implementations, the unit pixels (PX) included in the sensing region 31 may be arranged in the photoelectric conversion regions 311. The photoelectric conversion region 311 may occupy as large a region as possible within the pixel array 30.

FIG. 3 also illustrates circuits that are connected to the detection region 312 included in the unit pixel (PX).

In some implementations, the circuits connected to the detection region 312 may be formed over the same substrate as the substrate where the semiconductor layer 310 is formed. A region in which the above-mentioned circuits are formed will hereinafter be referred to as a circuit region 320.

The circuit region 320 may include a plurality of circuits to generate and process electrical signals based on the electrons captured by the detection region 312. The control signals RST, TRG, FDG, and SEL may be received from the row driver 41. In addition, a pixel voltage ($V_{px}$) may be a power-supply voltage (VDD) or a source voltage or ground voltage (VSS).

Although not shown in FIG. 3, in some implementations, the circuit region 320 may be disposed between the unit pixels (PX). In other implementations, the circuit region 320 may be formed to overlap with the sensing region 31 in which the unit pixels (PX) are disposed. The position of the circuit region 320 may vary depending on a layout and structure of the unit pixels.

The circuit region 320 may include a reset transistor RX, a transfer transistor TX, a first capacitor C1, a second capacitor C2, a floating diffusion transistor FDX, a drive transistor DX, and a selection transistor SX.

The reset transistor RX may be activated in response to a logic high level (logic high voltage level) of the reset signal RST applied to a gate electrode thereof, such that the voltage of the floating diffusion node FD and the voltage of the detection region 312 may be reset to a predetermined level (e.g., the pixel voltage $V_{px}$). In addition, when the reset transistor RX is activated (e.g., active state), the transfer transistor TX can also be activated (e.g., active state) to reset the floating diffusion node FD.

The transfer transistor TX may be activated (e.g., active state) in response to a logic high level of the transfer signal TRG applied to a gate electrode thereof, such that electrons accumulated in the detection region 312 can be transferred to the floating diffusion node FD.

The first capacitor C1 may be coupled to the floating diffusion node FD, and the first capacitor C1 can provide a predefined electrostatic capacity.

The second capacitor C2 may be selectively coupled to the floating diffusion node FD depending on which operation the floating diffusion transistor FDX performs, and the second capacitor C2 can provide additional predefined electrostatic capacity.

Each of the first capacitor C1 and the second capacitor C2 may include, for example, at least one of a Metal-Insulator-Metal (MIM) capacitor, a Metal-Insulator-Polysilicon (MIP) capacitor, a Metal-Oxide-Semiconductor (MOS) capacitor, and a junction capacitor.

The floating diffusion transistor FDX may be activated (e.g., active state) in response to a logic high level of the floating diffusion signal FDG applied to a gate electrode thereof, such that the floating diffusion transistor FDX may couple the second capacitor C2 to the floating diffusion node FD.

For example, when the amount of incident light is sufficient and the image sensor is under a relatively high illuminance condition, the row driver 41 may activate the floating diffusion transistor FDX, such that the floating diffusion transistor FDX enters the active state and the floating diffusion node FD can be coupled to the second capacitor C2. As a result, when the amount of incident light is sufficient and the image sensor is at a high illuminance level, the amount of photocharges accumulated in the floating diffusion node FD increases, enabling a high dynamic range (HDR) imaging.

On the other hand, when the amount of incident light is not sufficient and the image sensor is at a relatively low illuminance level, the row driver 41 may control the floating diffusion transistor FDX to be deactivated (e.g., inactive state), such that the floating diffusion node FD can be isolated from the second capacitor C2.

In some other implementations, the floating diffusion transistor FDX and the second capacitor C2 may be omitted as necessary.

A drain electrode of the drive transistor DX is coupled to the pixel voltage ($V_{px}$) and a source electrode of the drive transistor DX is coupled to a vertical signal line SL through the selection transistor SX, such that a load (MOS) of a constant current source circuit CS coupled to one end of the vertical signal line SL and a source follower circuit can be constructed. Thus, the drive transistor DX may output a current corresponding to the voltage of the floating diffusion node FD coupled to a gate electrode to the vertical signal line SL through the selection transistor SX.

The selection transistor SX may be activated (i.e., active state) in response to a logic high level of the selection signal SEL applied to a gate electrode thereof, such that the pixel signal generated from the drive transistor DX can be output to the vertical signal line SL.

The circuit region 320 may include a plurality of reset transistors (RX), a plurality of transfer transistors (TX), a plurality of first capacitors (C1), a plurality of second capacitors (C2), a plurality of floating diffusion transistors (FDX), a plurality of drive transistors (DX), and a plurality of selection transistors (SX) that correspond to the plurality of unit pixels (PX) included in the sensing region 31. That is, each unit pixel (PX) may include a reset transistor (RX), a transfer transistor (TX), a first capacitor (C1), a second capacitor (C2), a floating diffusion transistor (FDX), a drive transistor (DX), and a selection transistor (SX).

In some implementations, a noise cancellation and analog-to-digital (ADC) conversion processing may be performed on the pixel signals transferred from the circuit region 320 to the vertical signal line SL, converting each of the pixel signals into image data.

The image processor (not shown) may calculate image data acquired from electrons captured by the plurality of unit pixels (PX), and may thus calculate a phase difference using the resultant image data.

Figure 4:
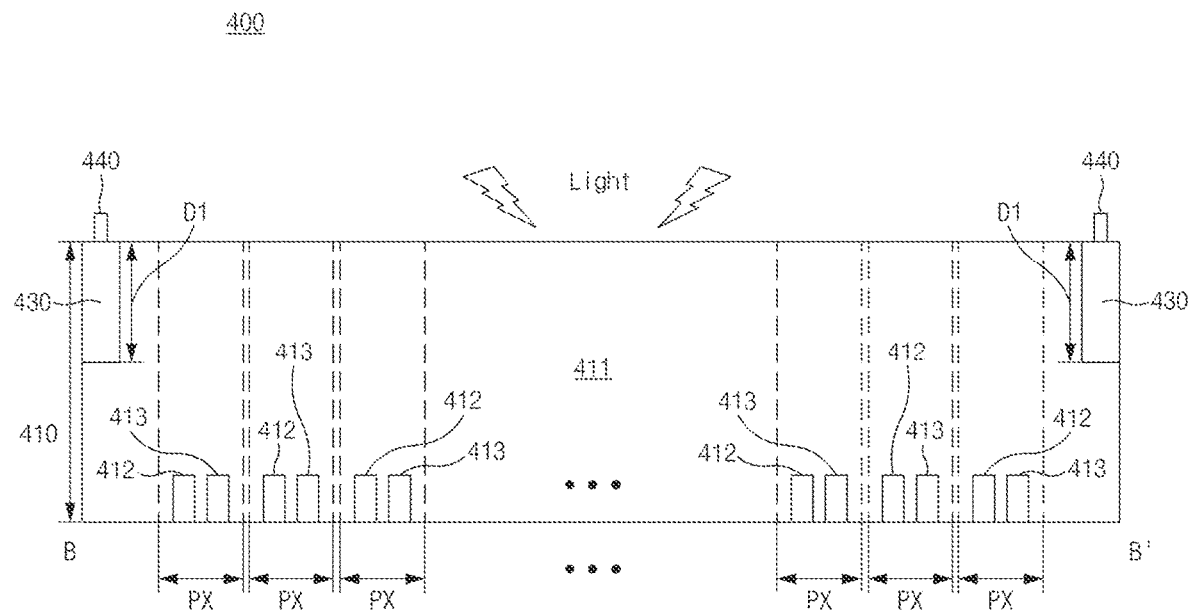
FIG. 4 is a cross-sectional view illustrating an example of the pixel array taken along a line B-B' shown in FIG. 2 based on some implementations of the disclosed technology.

FIG. 4 is a cross-sectional view 400 illustrating an example of the pixel array 30 taken along a line B-B' shown in FIG. 2 based on some implementations of the disclosed technology.

Referring to FIG. 4, a photoelectric conversion region 411, a plurality of unit pixels (PX) and at least one bias voltage region 430 may be part of a semiconductor layer 410. At least one contact portion 440 may be formed to be in electrical contact with the bias voltage region 430 to apply a bias voltage to the bias voltage region 430. In some implementation, the contact portion 440 may include one of various suitable contacts such as a metal contact, a doped contact region, or a contact plug structured to connect transistors and other devices in the semiconductor substrate to each other.

Each of the unit pixels (PX) may include a detection region 412 and a control region 413, and at least part of the photoelectric conversion region 411.

In some implementations, the structures and other technical features of the photoelectric conversion region 411, the detection region 412, and the control region 413 shown in FIG. 4 may be identical or similar to those of FIG. 3. The bias field region 430 and the contact portion 440 will hereinafter be described with reference to FIG. 4.

The bias field region 430 may be formed to extend from a light reception surface of the semiconductor layer 410 toward one surface facing the light reception surface.

The bias field region 430 may be formed below the contact portion 440, and may be formed in an edge of the pixel array 30. In this case, the edge of the pixel array 30 may be an edge region of the semiconductor layer 410.

The bias field region 430 may be formed in the edge of the pixel array 30 outside of the pixel array 30 without overlap with any unit pixel (PX) to make the effective area of a light reception region of the unit pixels (PX) as large as possible for receiving incident light to generate a sufficient amount of photocharge.

The bias field region 430 may be formed to have a first depth (D1) from the light reception surface of the semiconductor layer 410. Here, the first depth D1 may be a depth that is sufficiently deep to prevent dark current components in the contact portion 440 from affecting the unit pixel (PX). In addition, at the first depth (D1), the electric potential gradient inside the pixel array 30 can be easily adjusted by a bias voltage applied to the bias field region 430.

In some implementations, a depth where one surface of the bias field region 430 is located from the light reception surface of the semiconductor layer 410 may be referred to as a first depth D1. In this case, one surface of the bias field region 430 may be parallel to the light reception surface of the semiconductor layer 410, and may be located far from the light reception surface of the semiconductor layer 410.

However, when a region occupied by the bias field region 430 within the semiconductor layer 410 is large in size, a region occupied by the photoelectric conversion region 411 may not be sufficiently guaranteed. In addition, photocharges generated from the photoelectric conversion region 411 by the bias field region 430 may be recombined, reducing the photoelectric conversion efficiency of the pixel array 30.

Therefore, the first depth D1 may be a depth where occurrence of the electric potential gradient and dark current components created in the pixel array 30 can be easily adjusted and recombination of the photocharge can be prevented.

The plurality of unit pixels (PX) included in the sensing region 31 may be spaced apart from each other by a predetermined distance. As the unit pixels (PX) are spaced apart from each other by the predetermined distance, the photocharge collected by the respective unit pixels can be isolated from each other. In some implementations, the isolation structure capable of electrically isolating the unit pixels (PX) from each other may be disposed between the unit pixels (PX) so that the unit pixels (PX) can be easily isolated from each other by the isolation structure.

The electric potential gradient generated by a difference in doping concentration between the bias field region 430 and the semiconductor layer 410 and the electric potential gradient generated by the bias voltage may allow photocharge to be generated by the photoelectric conversion region 411 included in the semiconductor layer 410 to easily flow into the respective unit pixels (PX). Specifically, the generated photocharge may flow into the control region 413 included in each unit pixel (PX), and may be captured by the detection region 412.

Figure 5:
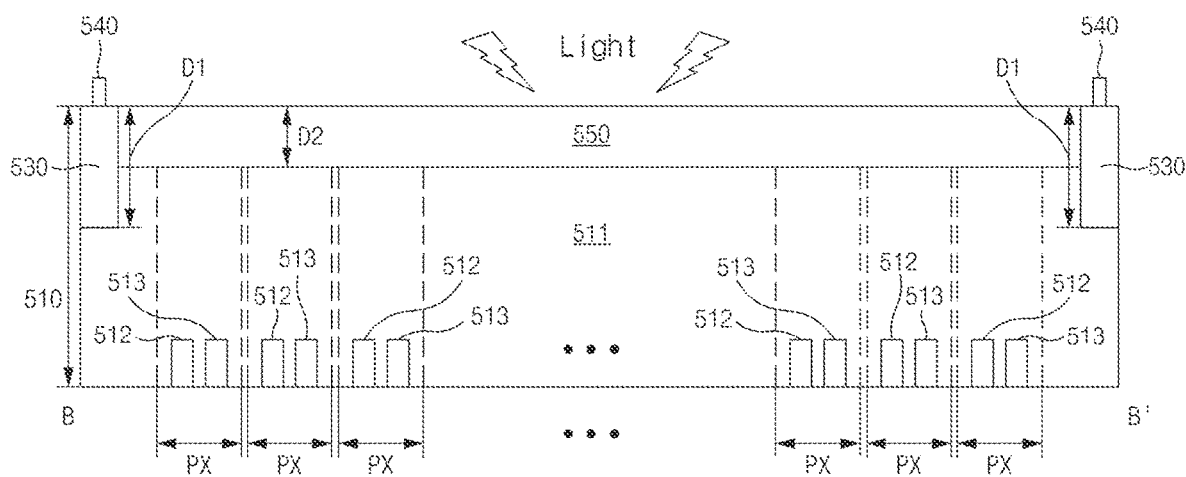
FIG. 5 is a cross-sectional view illustrating another example of the pixel array taken along the line B-B' shown in FIG. 2 based on some implementations of the disclosed technology.

FIG. 5 is a cross-sectional view 500 illustrating another example of the pixel array 30 taken along the line B-B' shown in FIG. 2 based on some implementations of the disclosed technology.

Referring to FIG. 5, a photoelectric conversion region 511, a plurality of unit pixels (PX), a bias voltage region 530, a contact portion 540, and a passivation region 550 may be formed in a semiconductor layer 510.

In some implementations, the structures and other technical features of the photoelectric conversion region 511, the detection region 512, the control region 513, the bias field region 530, and the contact portion 540 may be identical or similar to those of FIG. 4. The passivation region 550 will hereinafter be described with reference to FIG. 5.

The passivation region 550 may be doped with the same impurities as the semiconductor layer 510. For example, the passivation region 550 may be doped with P-type impurities. The passivation region 550 may have the same doping concentration as the bias field region 530.

The passivation region 550 may extend to a second depth D2 from a light reception surface of the semiconductor layer 510. In some implementations, the second depth D2 may be smaller than the first depth D1 formed by the bias field region 530 within the semiconductor layer 510.

In some implementations, a depth where one surface of the passivation region 550 is located from the light reception surface of the semiconductor layer 510 may be referred to as a second depth D2. In this case, one surface of the passivation region 550 may be parallel to the light reception surface of the semiconductor layer 510, and may be located far from the light reception surface of the semiconductor layer 510.

As the passivation region 550 is formed to have a smaller depth than the bias field region 530, recombination of photocharges generated in the passivation region 550 may be reduced. Photocharges recombined in the passivation region 550 may be photocharges generated by the photoelectric conversion region 511 disposed below the passivation region 550.

Photocharges generated by the photoelectric conversion region 511 may be combined with hole pairs of the passivation region 550 doped with the same impurities as the semiconductor layer 510, so that distortion of pixel signals may occur by recombination of the photocharges.

The passivation region 550 may be electrically coupled to the bias field region 530. As the passivation region 550 is electrically coupled to the bias field region 530, the electric potential gradient may occur between the control region 513 and the passivation region 550 of the unit pixel (PX) located adjacent to the center of the pixel array 30.

As the passivation region 550 is coupled to the bias field region 530, a bias voltage can be applied to the passivation region 550. As the bias voltage is applied to the passivation region 550, the electric potential gradient may occur between the passivation region 550 and the control region 513. In comparison with the case where the passivation region 550 is not formed, photocharges generated by the photoelectric conversion region 511 adjacent to the center of the pixel array 30 may easily flow into the unit pixels (PX).

In some implementations, as the passivation region 550 is located closer to the bias field region 530, the electric potential gradient formed between the passivation region 550 and the control region 513 may increase. In other words, as the distance from the passivation region 550 to the edge of the pixel array 30 becomes shorter, the electric potential gradient between the passivation region 550 and the control region 513 may increase.

In some implementations, the passivation region 550 may be formed to be isolated from the region where the bias voltage region 530 is formed.

For example, a mask pattern (e.g., photoresist) is formed over the remaining regions other than the region where the passivation region 550 is formed, and the passivation region 550 is then formed through an implantation process. Subsequently, a mask pattern is formed over the formed passivation region 550, and the bias field region 530 may be formed along the edge of the passivation region 550 by an implantation process.

In this case, a mask pattern is formed over the passivation region 550 by formation of the bias field region 530, and the passivation region 550 overlaps the sensing region 31.

Figure 6:
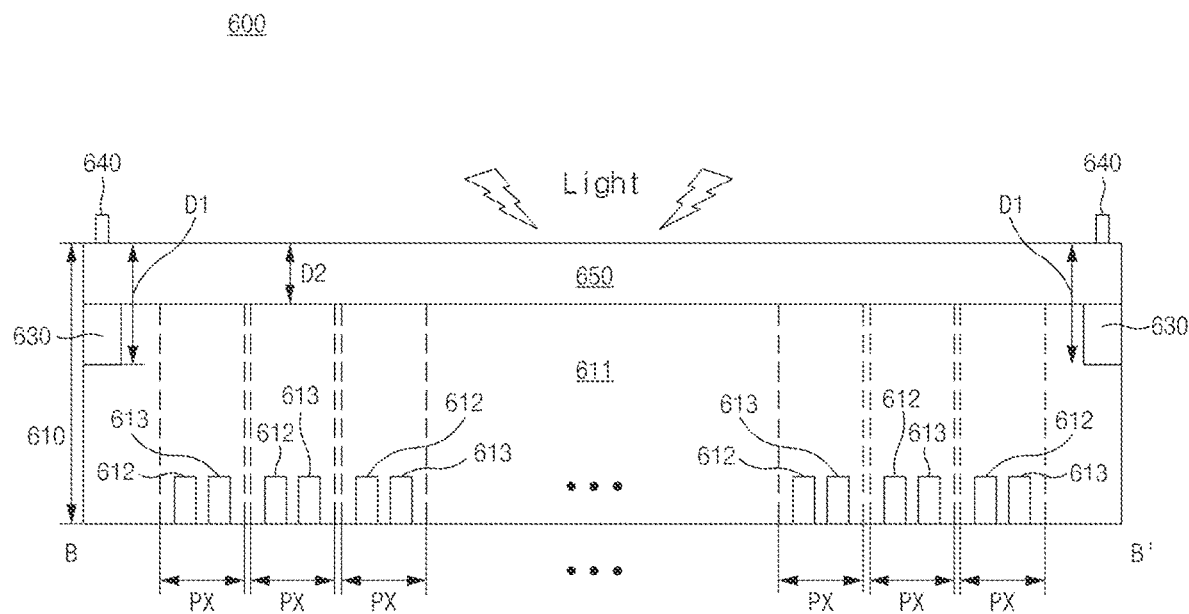
FIG. 6 is a cross-sectional view illustrating still another example of the pixel array taken along the line B-B' shown in FIG. 2 based on some implementations of the disclosed technology.

FIG. 6 is a cross-sectional view 600 illustrating still another example of the pixel array 30 taken along the line B-B' shown in FIG. 2 based on some implementations of the disclosed technology.

Referring to FIG. 6, a photoelectric conversion region 611, a plurality of unit pixels (PX), a bias voltage region 630, a contact portion 640, and a passivation region 650 may be formed in a semiconductor layer 610.

In some implementations, the structures and other technical features of the photoelectric conversion region 611, the detection region 612, and the control region 613 other than the passivation region 650 and the bias voltage region 630 may be identical or similar to those of FIG. 5.

In some other implementations, the passivation region 650 may extend to a second depth D2 from a light reception surface of the semiconductor layer 610. In addition, the bias field region 630 may be formed to have a first depth D1 from the semiconductor layer 610. The second depth D2 may be smaller than the first depth D1 formed by the bias field region 630 within the semiconductor layer 610.

In some implementations, a depth where one surface of the bias field region 630 is located from the light reception surface of the semiconductor layer 610 may be referred to as a first depth D1. In this case, one surface of the bias field region 630 may be parallel to the light reception surface of the semiconductor layer 610, and may be located far from the light reception surface of the semiconductor layer 610.

In some implementations, a depth where one surface of the passivation region 650 is located from the light reception surface of the semiconductor layer 610 may be referred to as a second depth D2. In this case, one surface of the passivation region 650 may be parallel to the light reception surface of the semiconductor layer 610, and may be located far from the light reception surface of the semiconductor layer 610.

The passivation region 650 and the bias field region 630 may have the same impurity types and the same doping concentration.

In addition, the passivation region 650 may be electrically coupled to the bias field region 630. As the passivation region 650 is electrically coupled to the bias field region 630, the electric potential gradient may occur between the control region 613 and the passivation region 650 of the unit pixel (PX) located adjacent to the center of the pixel array 30.

In some other implementations, after formation of the passivation region 650, the bias voltage region 630 may be formed through the implantation process.

For example, after the passivation region 650 is formed to have the second depth D2 from the light reception surface of the semiconductor layer 610, a mask pattern is formed over part of the formed passivation region 650, and the bias field region 630 may be formed along the edge of the passivation region 650 through the implantation process. In this case, when the bias field region 630 is formed, the masked passivation region 650 may be formed to overlap the sensing region 31.

In some other implementations, the formed bias field region 630 may be formed to overlap the passivation region 650.

Figure 7:
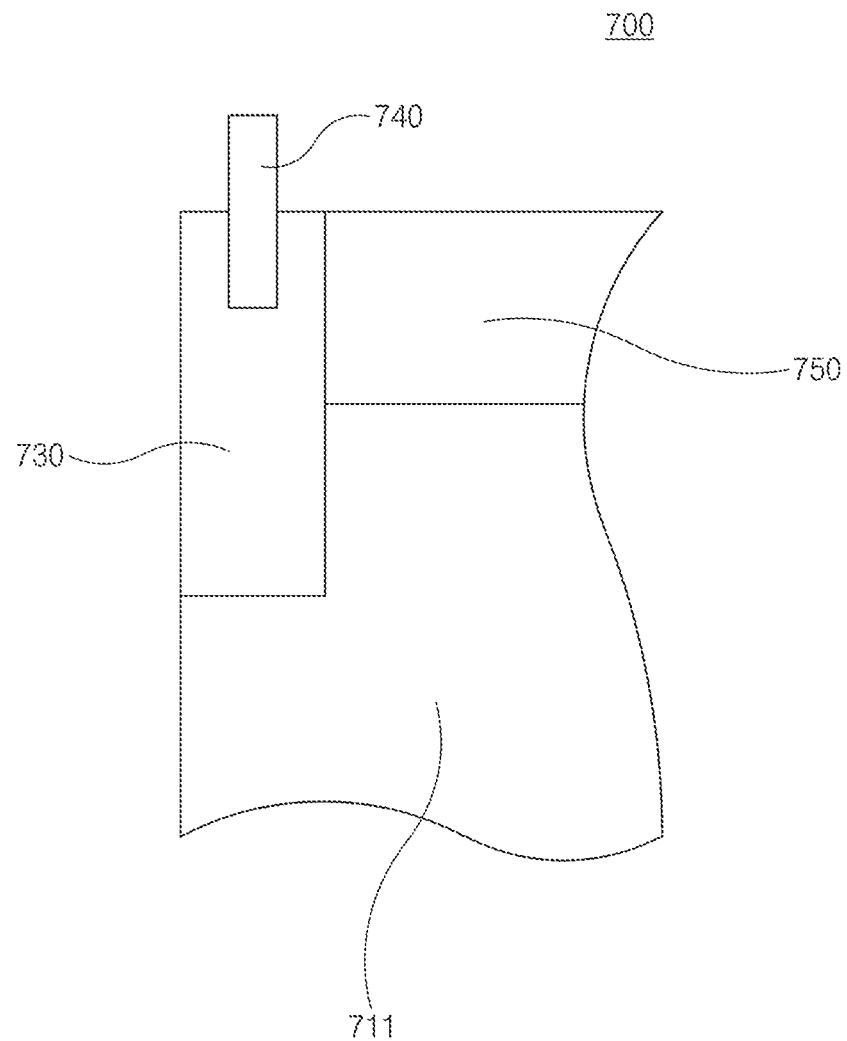
FIG. 7 is a cross-sectional view illustrating a partial structure of the pixel array that includes a contact portion based on some other implementations of the disclosed technology.

FIG. 7 is a cross-sectional view illustrating a partial structure 700 of the pixel array 30 that includes a contact portion 740 based on some other implementations of the disclosed technology.

In some implementations, the structures and other technical features of a photoelectric conversion region 711 and a passivation region 750 shown in FIG. 7 are identical or similar to those of FIG. 6. The constituent elements shown in FIG. 7 will hereinafter be described and specifically the bias field region 730 and the contact portion 740 will be discussed below.

Referring to FIG. 7, the contact portion 740 may etch part of the bias field region 730, so that the contact portion 740 may be formed to contact the etched bias field region 730. As the contact portion 740 is formed at the position where the bias field region 730 is etched, the contact portion 740 and the bias field region 730 can be stably coupled to each other.

In addition, as the contact portion 740 is formed at the position where the bias field region 730 is etched, the bias voltage provided by the contact portion 740 can efficiently move electrons of the photoelectric conversion region 711.

In other words, as the contact portion 740 is formed at the position where the bias field region 730 is etched, the bias voltage can more greatly affect the photoelectric conversion region 711, so that photocharges can easily move by the bias voltage.

When the bias field region 730 is etched to form the contact portion 740, damage to the surface of the bias field region 730 may occur, and dark current components may also occur in the etched region. Accordingly, as the depth where the bias field region 730 is formed can be sufficiently guaranteed, dark current components generated in the etched region can be prevented from penetrating into the photoelectric conversion region 711.

Figure 8:
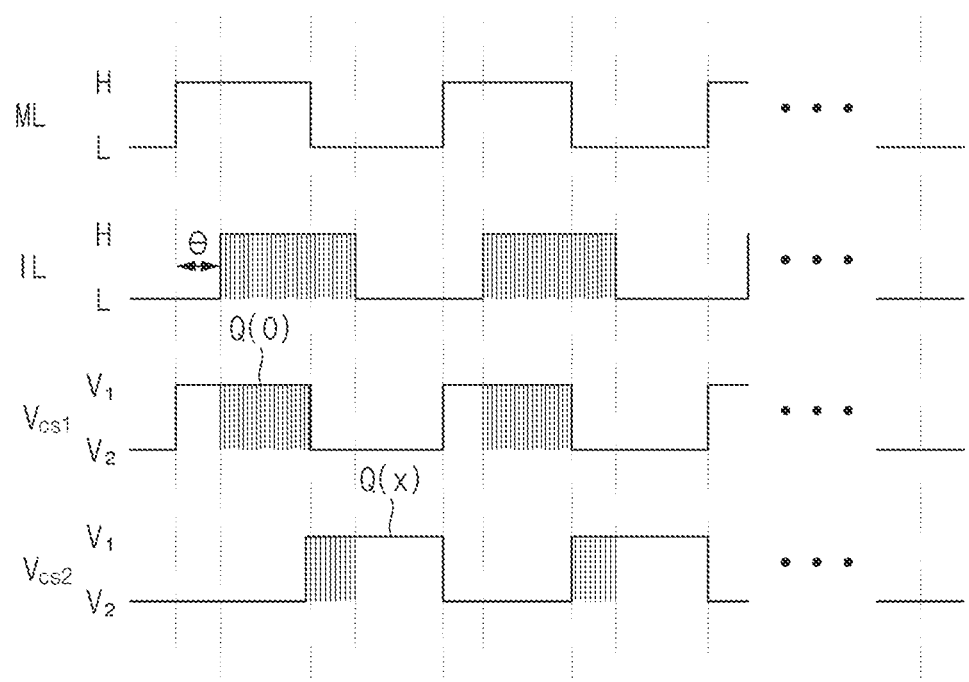
FIG. 8 is a timing diagram illustrating an example of a phase difference between demodulation control signals based on some implementations of the disclosed technology.

FIG. 8 is a timing diagram illustrating an example of a phase difference between demodulation control signals $V_{cs1}$ and $V_{cs2}$ based on some implementations of the disclosed technology.

Referring to FIG. 8, the modulated light (ML), the incident light (IL), and the first and second demodulation control signals $V_{cs1}$ and $V_{cs2}$ are illustrated in FIG. 8.

In association with the plurality of unit pixels (PX) included in the sensing region 31, different demodulation control signals may be applied to the adjacent unit pixels (PX).

The first demodulation control signal ($V_{cs1}$) and the second demodulation control signal ($V_{cs2}$) may be applied to the control regions (e.g., 313 of FIG. 3) respectively included in the unit pixels (PX).

The first demodulation control signal ($V_{cs1}$) may have a phase difference of 180° (n) with respect to the second demodulation control signal ($V_{cs2}$). For example, the first demodulation control signal ($V_{cs1}$) may have the same phase as the modulated light (ML), and the second demodulation control signal ($V_{cs2}$) may have a phase difference of 180° (π) with respect to the modulated light (ML).

The first demodulation control signal ($V_{cs1}$) may be a signal for periodically applying the first voltage ($V_1$) and the second voltage ($V_2$) to the control region (e.g., 313 of FIG. 3) included in each unit pixel (PX).

Similarly, the second demodulation control signal ($V_{cs2}$) may be a signal for periodically applying the first voltage ($V_1$) and the second voltage ($V_2$) to the control region (e.g., 313 of FIG. 3) included in each unit pixel (PX).

The respective unit pixels may detect electrons corresponding to incident light received at a time point where the demodulation control signal $V_{cs1}$ or $V_{cs2}$ has the first voltage ($V_1$).

For example, photocharges generated by each of the photoelectric conversion regions (e.g., 311 of FIG. 3)

respectively included in the unit pixels (PX) may be captured by the detection region 312 when each of the first and second demodulation control signals $V_{cs1}$ and $V_{cs2}$ has the first voltage ($V_1$).

After the captured electrons have moved through the transfer transistor TX, the electrons may be accumulated in the floating diffusion region (FD). The electrons accumulated in the floating diffusion region (FD) may be output as a pixel signal after passing through the drive transistor DX and the selection transistor SX.

After the pixel signal has been output, the unit pixels (PX) may be reset to a predetermined voltage (e.g., a pixel voltage $V_{px}$) by the reset transistor RX.

While the pixel signal of the unit pixel (PX) is detected, the bias voltage may be applied to the bias field region (e.g., 32 of FIG. 2). As described above, since the bias voltage is applied to the bias field region, electrons can be easily detected by the detection region 312.

The modulated light (ML) may refer to light that is emitted to the target object 1 by the light source 10 controlled by the control block 40. The modulated light (ML) may be generated to alternately have a high-level section (i.e., a period in which light is emitted) and a low-level section (i.e., a period in which light is not emitted).

The incident light (IL) may refer to light that is incident upon the substrate to generate electron-hole pairs through the photoelectric conversion effect. The incident light (IL) may have a phase difference (θ) that is changed with the distance between the image sensing device ISD and the target object 1.

The level of each of the modulated light (ML) and the incident light (IL) shown in FIG. 8 may refer to the intensity of light. For example, "H" may refer to high-intensity light, and "L" may refer to low-intensity light.

While electrons generated by the incident light (IL) are captured in the detection region 312 included in each of the unit pixels (PX), each of the first demodulation control signal ($V_{cs1}$) and the second demodulation control signal ($V_{cs2}$) may alternately apply the first voltage ($V_1$) and the second voltage ($V_2$) to the connected control region 313 at predetermined time intervals.

A logic level of the demodulation driver 42 for applying the first voltage ($V_1$) to the control region 313 by the demodulation control signal may be considered to be a logic high level (H). In addition, a logic level of the demodulation driver 42 for applying the second voltage ($V_2$) to the control region 313 by the demodulation control signal may be considered to be a logic low level (L). For example, the first voltage ($V_1$) may be 1.2 V, and the second voltage ($V_2$) may be zero volts (0V).

In addition, the first demodulation control signal ($V_{cs1}$) may have the same phase as the modulated light (ML), and the second demodulation control signal ($V_{cs2}$) may have a phase difference of 180° (π) with respect to the modulated light (ML).

In some implementations, it is assumed that no phase difference occurs between the light modulation signal generating the modulated light (ML) and the modulated light (ML) for convenience of description, such that the light modulation signal and the modulated light (ML) may have the same phase.

The incident light (IL) having a phase difference (θ) with respect to the modulated light (ML) may be incident upon the substrate. The unit pixels may capture photocharges generated by the incident light (IL) in a time period in which the demodulation control signals ($V_{cs1}$-$V_{cs2}$) respectively applied to the unit pixels (PX) have the logic high level (H).

The image sensing device ISD may perform the sensing operation and the distance information detection in units of two adjacent unit pixels (PX).

Each of the unit pixels (PX) arranged in the sensing region 31 may receive a demodulation control signal corresponding to any one of the first and second demodulation control signals ($V_{cs1}$-$V_{cs2}$). Each of the unit pixels (PX) may output a pixel signal corresponding to electrons that are applied to the floating diffusion region (FD). The image processor (not shown) may acquire the distance from the image sensing device ISD to the target object 1 by processing the output pixel signal.

The image sensing device ISD may calculate a phase difference (θ) using the pixel signals detected by the unit pixels (PX). In some implementations, one pixel signal detected by one unit pixel receiving the first demodulation control signal ($V_{cs1}$) will hereinafter be referred to as Q(0), and the other pixel signal detected by the other unit pixel receiving the second demodulation control signal ($V_{cs2}$) will hereinafter be referred to as Q(π).

The electrons generated by incident light (IL) applied to the pixel array 30 may be divisionally captured by two adjacent unit pixels (PX) in different ways according to the respective phases.

The image processor (not shown) may receive image data corresponding to the pixel signal Q(0) and image data corresponding to the pixel signal Q(π) from the adjacent unit pixels (PX), and may calculate a phase difference based on the received image data.

Figure 9:
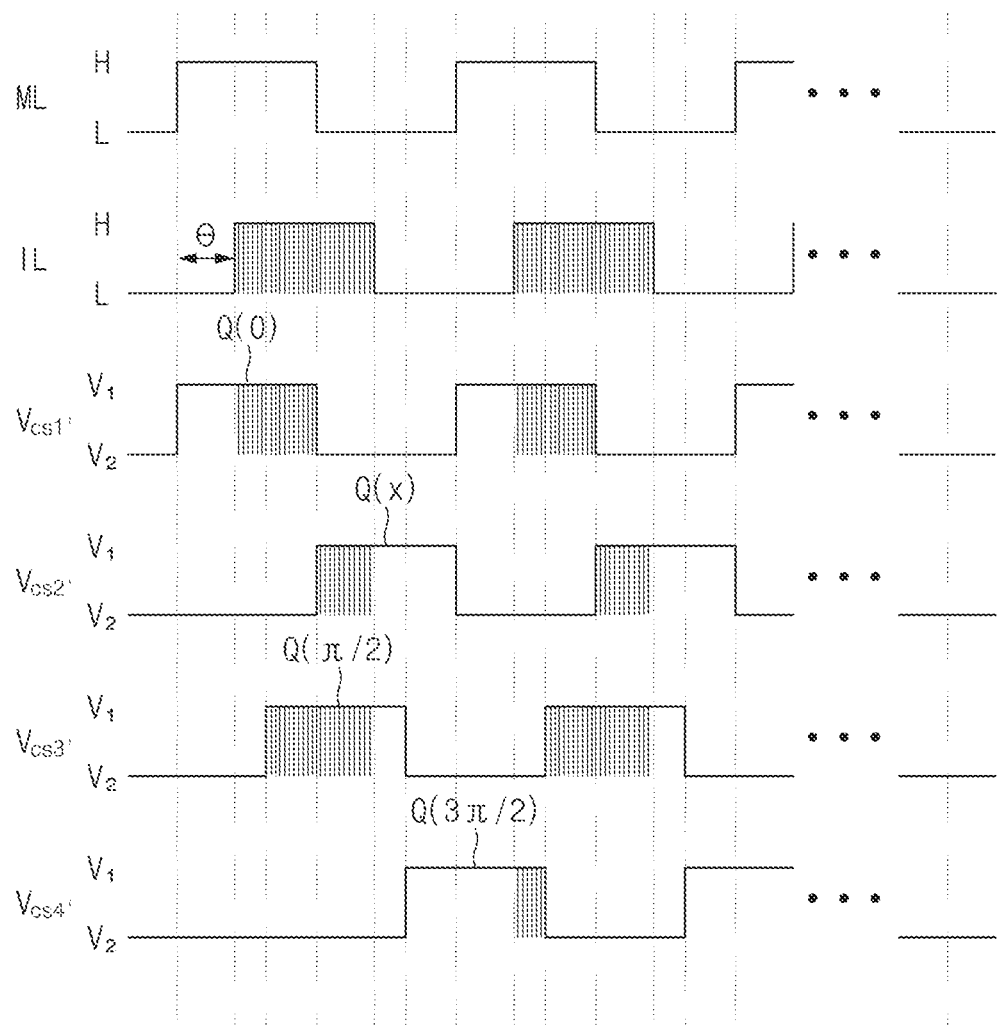
FIG. 9 is a timing diagram illustrating an example of a phase difference between demodulation control signals based on some implementations of the disclosed technology.

FIG. 9 is a timing diagram illustrating an example of a phase difference between demodulation control signals ($V_{cs1'}$, $V_{cs2'}$, $V_{cs3'}$, $V_{cs4'}$) based on some implementations of the disclosed technology.

Referring to FIG. 9, the modulated light (ML), the incident light (IL), and the first to fourth demodulation control signals ($V_{cs1'}$-$V_{cs4'}$) are illustrated in FIG. 9.

In association with the plurality of unit pixels (PX) included in the sensing region 31, different demodulation control signals may be applied to the adjacent unit pixels (PX). For example, the first to fourth demodulation control signals ($V_{cs1'}$-$V_{cs4'}$) may be respectively applied to the control regions (e.g., 313 of FIG. 3) respectively included in four adjacent unit pixels (PX) arranged in a (2×2) matrix array.

The first demodulation control signal ($V_{cs1'}$) may have a phase difference of 180° (π) with respect to the second demodulation control signal ($V_{cs2'}$). The third demodulation control signal ($V_{cs3'}$) may have a phase difference of 90° with respect to the first demodulation control signal ($V_{cs1'}$). The fourth demodulation control signal ($V_{cs4'}$) may have a phase difference of 270° with respect to the first demodulation control signal ($V_{cs1'}$).

Each of the first to fourth demodulation control signals ($V_{cs1'}$-$V_{cs4'}$) may be a signal for periodically applying each of the first voltage ($V_1$) and the second voltage ($V_2$) to the control region (e.g., 313 of FIG. 3) included in each unit pixel (PX).

The respective unit pixels (PX) may detect electrons corresponding to incident light received at a time point where each of the demodulation control signals ($V_{cs1'}$-$V_{cs4'}$) has the first voltage ($V_1$).

For example, photocharges generated by each of the photoelectric conversion regions (e.g., 311 of FIG. 3) respectively included in the unit pixels (PX) may be captured by the detection region 312 when each of the first to fourth demodulation control signals ($V_{cs1'}$-$V_{cs4'}$) has the first voltage ($V_1$).

While the pixel signal of the unit pixel (PX) is detected, the bias voltage may be applied to the bias field region (e.g., 32 of FIG. 2). As described above, since the bias voltage is applied to the bias field region, electrons can be easily detected by the detection region 312.

The modulated light (ML) may refer to light that is emitted to the target object 1 by the light source 10 controlled by the control block 40. The modulated light (ML) may be generated to alternately have a high-level section (i.e., a period in which light is emitted) and a low-level section (i.e., a period in which light is not emitted).

The incident light (IL) may refer to light that is incident upon the substrate to generate electron-hole pairs through the photoelectric conversion effect. The incident light (IL) may have a phase difference (θ) that is changed with the distance between the image sensing device ISD and the target object 1.

The level of each of the modulated light (ML) and the incident light (IL) shown in FIG. 9 may refer to the intensity of light. For example, "H" may refer to high-intensity light, and "L" may refer to low-intensity light.

While electrons generated by the incident light (IL) are captured in the detection region 312 included in each of the unit pixels (PX), each of the first demodulation control signal ($V_{cs1'}$) and the second demodulation control signal ($V_{cs2'}$) may alternately apply the first voltage ($V_1$) and the second voltage ($V_2$) to the connected control region 313 at predetermined time intervals.

A logic level of the demodulation driver 42 for applying the first voltage ($V_1$) to the control region 313 by the demodulation control signal may be considered to be a logic high level (H). In addition, a logic level of the demodulation driver 42 for applying the second voltage ($V_2$) to the control region 313 by the demodulation control signal may be considered to be a logic low level (L). For example, the first voltage ($V_1$) may be 1.2 V, and the second voltage ($V_2$) may be zero volts (0V).

In addition, the first demodulation control signal ($V_{cs1'}$) may have the same phase as the modulated light (ML), the second demodulation control signal ($V_{cs2'}$) may have a phase difference of 180° (π) with respect to the modulated light (ML), the third demodulation control signal ($V_{cs3'}$) may have a phase difference of 90° (π/2) with respect to the modulated light (ML), and the fourth demodulation control signal ($V_{cs4'}$) may have a phase difference of 270° (3π/2) with respect to the modulated light (ML).

In some implementations, it is assumed that no phase difference occurs between the light modulation signal generating the modulated light (ML) and the modulated light (ML) for convenience of description, such that the light modulation signal and the modulated light (ML) may have the same phase.

The incident light (IL) having a phase difference (θ) with respect to the modulated light (ML) may be incident upon the substrate. The unit pixels may capture photocharges generated by the incident light (IL) in a time period in which the demodulation control signals ($V_{cs1'}$-$V_{cs4'}$) respectively applied to the unit pixels (PX) have the logic high level (H).

The image sensing device ISD may perform the sensing operation and the distance information detection in units of four adjacent unit pixels (PX).

Each of the unit pixels (PX) arranged in the sensing region 31 may receive a demodulation control signal corresponding to any one of the first to fourth demodulation control signals ($V_{cs1'}$-$V_{cs4'}$). Each of the unit pixels (PX) may output a pixel signal corresponding to electrons that are applied to the floating diffusion region (FD). The image processor (not shown) may acquire the distance from the image sensing device ISD to the target object 1 by processing the output pixel signal.

The image sensing device ISD may calculate a phase difference (θ) using the pixel signals detected by the respective unit pixels (PX). In some implementations, a pixel signal detected by a unit pixel receiving the first demodulation control signal ($V_{cs1'}$) will hereinafter be referred to as Q(0), and a pixel signal detected by a unit pixel receiving the second demodulation control signal ($V_{cs2'}$) will hereinafter be referred to as Q(π). In addition, a pixel signal detected by a unit pixel receiving the third demodulation control signal ($V_{cs3'}$) will hereinafter be referred to as Q(π/2), and a pixel signal detected by a unit pixel receiving the fourth demodulation control signal ($V_{cs4'}$) will hereinafter be referred to as Q(3π/2).

The electrons generated by incident light (IL) applied to the pixel array 30 may be divisionally captured by four adjacent unit pixels (PX) in different ways according to the respective phases.

The image processor (not shown) may receive image data corresponding to the pixel signal Q(0), image data corresponding to the pixel signal Q(π), image data corresponding to the pixel signal Q(π/2), and image data corresponding to the pixel signal Q(3π/2) from the adjacent unit pixels (PX), and may calculate a phase difference based on the received image data.

Figure 10:
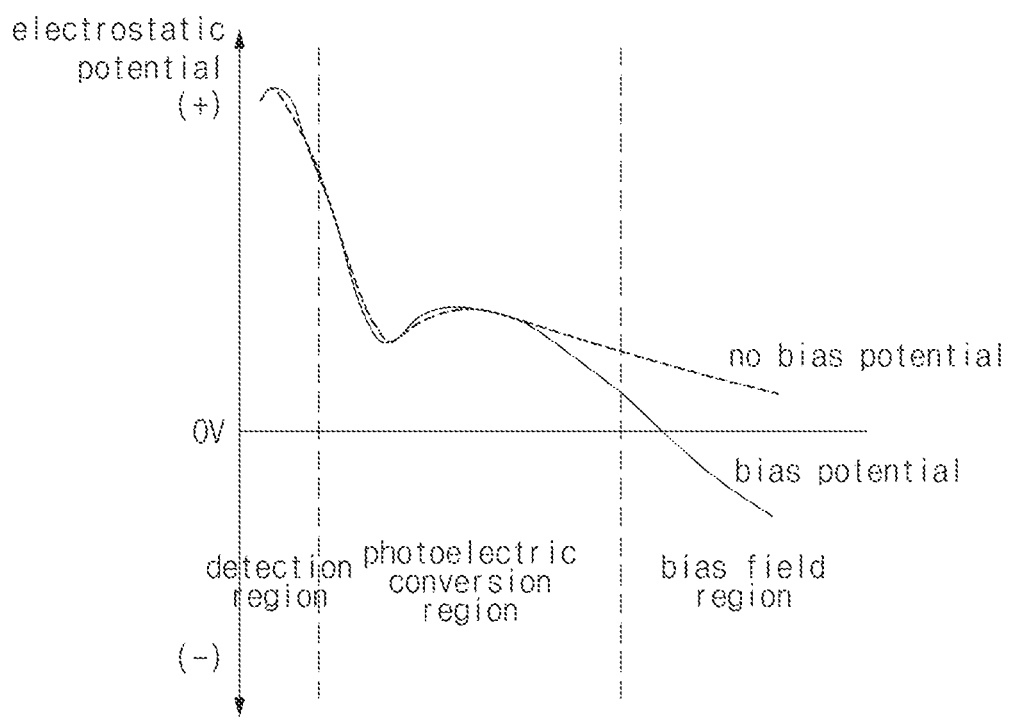
FIG. 10 is a graph illustrating an example of an electric potential gradient generated in response to a bias voltage based on some implementations of the disclosed technology.

FIG. 10 is a graph illustrating an example of the electric potential gradient generated in response to a bias voltage based on some implementations of the disclosed technology.

Specifically, FIG. 10 illustrates examples of electrostatic potentials of the bias field region, the photoelectric conversion region, and the detection region.

Referring to FIG. 10, the bias voltage (bias potential) may be a negative(−) voltage. As the bias voltage is applied to the bias field region, the electrostatic potential of the bias field region may be a negative(−) voltage.

When the bias voltage is provided to the bias field region (see "bias potential curve"), the electric potential gradient between the bias field region and the photoelectric conversion region may greatly increase as compared to the other case where no bias voltage is provided to the bias field region (see "no bias potential curve").

Therefore, when the bias voltage is provided to the bias field region (see "bias potential curve"), photocharges can more easily move from the bias field region to each of the photoelectric conversion region and the detection region, as compared to the other case where no bias voltage is provided to the bias field region (see "no bias potential curve"). In addition, when the bias voltage is provided to the bias field region (see "bias potential curve"), photocharges can more easily move from the photoelectric conversion region to the detection region, as compared to the other case where no bias voltage is provided to the bias field region (see "no bias potential curve").

As is apparent from the above description, the image sensing device based on some implementations of the disclosed technology can enable the bias field region to be disposed along the edge of the sensing region, and can adjust an electric field of the substrate by the bias voltage provided in the bias field region.

The image sensing device based on some implementations of the disclosed technology can mitigate the recombination phenomenon of electrons generated in response to incident light by adjusting the depth of a bias field region, and can prevent occurrence of dark current caused by formation of a contact region.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein. In addition, claims that are not explicitly presented in the appended claims may be presented in combination as an embodiment or included as a new claim by a subsequent amendment after the application is filed.

Although a number of illustrative embodiments have been described, it should be understood that various modifications and/or enhancements of the disclosed embodiments and other embodiments can be devised based on what is described and/or illustrated in this patent document.

What is claimed is:

1. An image sensing device comprising:
   a pixel array
   wherein the pixel array includes:
      a sensing region including a plurality of unit pixels, each unit pixel configured to detect incident light to generate photocharge indicative of the detected incident light;
      a bias field region doped with impurities and disposed along an edge of the sensing region; and
      a contact portion connected to the bias field region to apply a bias voltage to the bias field region to move the photocharge in the sensing region.

2. The image sensing device according to claim 1, wherein the pixel array further includes:
   a passivation region formed to overlap the sensing region,
   wherein the pixel array is formed in a semiconductor layer, wherein the bias field region is located at a first depth within the semiconductor layer and the passivation region is located at a second depth within the semiconductor layer, and wherein the first depth is greater than the second depth.

3. The image sensing device according to claim 2, wherein:
   the bias field region is formed to surround the passivation region; and
   the bias field region is formed to contact the contact portion.

4. The image sensing device according to claim 2, wherein:
   the bias field region is disposed along an edge of the passivation region; and
   the passivation region is formed to overlap the bias field region.

5. The image sensing device according to claim 1, wherein each of the unit pixels includes:
   a control region configured to generate a current in the semiconductor layer in which the unit pixels are disposed; and
   a detection region configured to capture the photocharges moving by the current.

6. The image sensing device according to claim 5, wherein:
   a demodulation control signal is applied to the control region,
   wherein the demodulation control signal is formed by repeating a first voltage and a second voltage at predetermined time intervals.

7. The image sensing device according to claim 6, wherein:
   the demodulation control signal is any one of two different demodulation control signals having a phase difference of 180 degrees therebetween.

8. The image sensing device according to claim 6, wherein:
   the demodulation control signal is any one of four different demodulation control signals having a phase difference of 90 degrees therebetween.

9. The image sensing device according to claim 6, wherein:
   the photocharges move in a direction from the bias field region to the control region.

10. The image sensing device according to claim 6, wherein:
    the bias voltage is lower than each of the first voltage and the second voltage.

11. An image sensing device comprising:
    a sensing region including a plurality of unit pixels, each unit pixel including a control region for receiving a first voltage or a second voltage and a detection region for capturing electrons moving by the first voltage or the second voltage;
    a bias field region disposed along an edge of the sensing region;
    a contact portion connected to the bias field region to apply a bias voltage to the bias field region; and
    a bias voltage controller configured to transfer the bias voltage to the contact portion,
    wherein the bias voltage is lower than each of the first voltage and the second voltage.

12. The image sensing device according to claim 11, further comprising:
    a passivation region formed to overlap the sensing region,
    wherein the bias field region is located at a first depth within a semiconductor layer and the passivation region is located at a second depth within the semiconductor layer, and wherein the first depth is greater than the second depth.

13. The image sensing device according to claim 12, wherein:
    the bias field region is formed to surround the passivation region; and
    the bias field region is formed to contact the contact portion.

14. The image sensing device according to claim 12, wherein:
    the bias field region is disposed along an edge of the passivation region; and
    the passivation region is formed to overlap the bias field region.

15. An image sensing device comprising:
    a sensing region including a plurality of unit pixels formed in a substrate to generate the photocharges and capture the generated photocharges;
    a bias field region doped with a first impurity and formed from a surface of the substrate to a first depth in the substrate along an edge of the sensing region;
    a passivation region doped with a first impurity and formed from the surface of the substrate to a second depth in the substrate over the sensing region; and
    a contact portion connected to the bias field region to apply a bias voltage to the bias field region to move the photocharges,
    wherein the first depth is greater than the second depth.

16. The image sensing device according to claim 15, wherein:

the bias field region is formed to surround the passivation region; and the bias field region is formed to contact the contact portion.

17. The image sensing device according to claim 15, wherein:

the bias field region is disposed along an edge of the passivation region; and the passivation region is formed to overlap the bias field region.

18. The image sensing device according to claim 15, wherein each of the unit pixels includes:

a control region configured to generate a current in the semiconductor layer in which the unit pixels are disposed; and a detection region configured to capture the photocharges moving by the current.

* * * * *